(12) United States Patent
Hashimoto et al.

(10) Patent No.: US 10,916,318 B2
(45) Date of Patent: Feb. 9, 2021

(54) MAGNETIC STORAGE DEVICE

(71) Applicant: TOSHIBA MEMORY CORPORATION, Tokyo (JP)

(72) Inventors: Susumu Hashimoto, Nerima Tokyo (JP); Masaki Kado, Kamakura Kanagawa (JP); Michael Arnaud Quinsat, Yokohama Kanagawa (JP); Nobuyuki Umetsu, Kawasaki Kanagawa (JP); Tsuyoshi Kondo, Kawasaki Kanagawa (JP); Yasuaki Ootera, Yokohama Kanagawa (JP); Shiho Nakamura, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/543,739

(22) Filed: Aug. 19, 2019

(65) Prior Publication Data

US 2020/0303026 A1 Sep. 24, 2020

(30) Foreign Application Priority Data

Mar. 19, 2019 (JP) ................. 2019-051605

(51) Int. Cl.
*G11C 11/15* (2006.01)
*G11C 19/08* (2006.01)
*G11C 11/16* (2006.01)

(52) U.S. Cl.
CPC .......... *G11C 19/0808* (2013.01); *G11C 11/15* (2013.01); *G11C 11/161* (2013.01)

(58) Field of Classification Search
CPC .... G11C 19/0808; G11C 11/161; G11C 11/15
USPC .......................................................... 365/173
See application file for complete search history.

(56) References Cited

U.S. PATENT DOCUMENTS

| 9,190,168 | B2 | 11/2015 | Nakamura et al. |
| 9,293,696 | B2 | 3/2016 | Ootera et al. |
| 10,032,499 | B2 | 7/2018 | Kado et al. |
| 2013/0082787 | A1* | 4/2013 | Zhang ............ G11C 5/005 331/107 R |
| 2015/0296667 | A1 | 10/2015 | Hirose et al. |

(Continued)

FOREIGN PATENT DOCUMENTS

| JP | 5370907 B2 | 12/2013 |
| JP | 5746595 B2 | 7/2015 |
| JP | 6091460 B2 | 3/2017 |

*Primary Examiner* — Tha-O H Bui
(74) *Attorney, Agent, or Firm* — Finnegan, Henderson, Farabow, Garrett & Dunner, L.L.P.

(57) ABSTRACT

A magnetic storage device of an embodiment includes: a first magnetic part including a first portion and a second portion and extending in a first direction from the first portion to the second portion; a layered part which is stacked on the first magnetic part in a second direction intersecting with the first direction; a first electrode electrically connected with the first portion; and a second electrode electrically connected with the second portion. The layered part includes a first layer and a second layer which is disposed between the first layer and the first magnetic part, the second layer includes a metal oxide, and the first layer includes at least one selected from the group consisting of a metal nitride and a metal carbide.

20 Claims, 4 Drawing Sheets

(56) References Cited

U.S. PATENT DOCUMENTS

2015/0380638 A1* 12/2015 Ootera ................ G11C 11/1675
                                                                  257/421
2018/0254076 A1    9/2018 Morise et al.
2019/0305212 A1* 10/2019 Gosavi .................... H04L 43/06

* cited by examiner

MAGNETIC STORAGE DEVICE

CROSS REFERENCE TO RELATED APPLICATION

This application is based upon and claims the benefit of priority from Japanese Patent Application No. 2019-051605, filed on Mar. 19, 2019; the entire contents of which are incorporated herein by reference.

FIELD

Embodiments described herein generally relate to a magnetic storage device.

BACKGROUND

In recent years, a report has been made of a phenomenon that domain walls on a magnetic nanowire are shifted by a current passed to the magnetic nanowire, and an attempt has been made to configure a magnetic memory using this phenomenon. In this attempt, a nanowire (magnetic nanowire) formed of a magnetic material, and an element which writes magnetic domains to the magnetic nanowire and an element which detects the magnetization directions of the magnetic domains are provided. On both ends of the magnetic nanowire, electrodes are provided, and domain walls of the written magnetic domains are shifted by a current passed to the magnetic nanowire. Information is recorded in the magnetization directions of the magnetic domains demarcated by the domain walls as in other magnetic storage devices such as a hard disk. In a magnetic storage device (magnetic memory) using the magnetic nanowire, an improvement in magnetic property of its magnetic storage layer is required in order to achieve an improvement in read accuracy from the magnetic domains, the stabilization of stored information, and so on.

SUMMARY

A magnetic storage device of an embodiment includes: a first magnetic part including a first portion and a second portion and extending in a first direction from the first portion to the second portion; a layered part which is stacked on the first magnetic part in a second direction intersecting with the first direction; a first electrode electrically connected with the first portion; and a second electrode electrically connected with the second portion. The layered part includes a first layer and a second layer which is disposed between the first layer and the first magnetic part, the second layer includes a metal oxide, and the first layer includes at least one selected from the group consisting of a metal nitride and a metal carbide.

DETAILED DESCRIPTION

Hereinafter, magnetic storage devices of embodiments will be described with reference to the drawings. In the embodiments, substantially the same constituent parts are denoted by the same reference signs, and a description thereof may be partly omitted. The drawings are schematic, and a relation of thickness and planer dimension, a thickness ratio among parts, and so on may be different from actual ones.

First Embodiment

Figure 1:
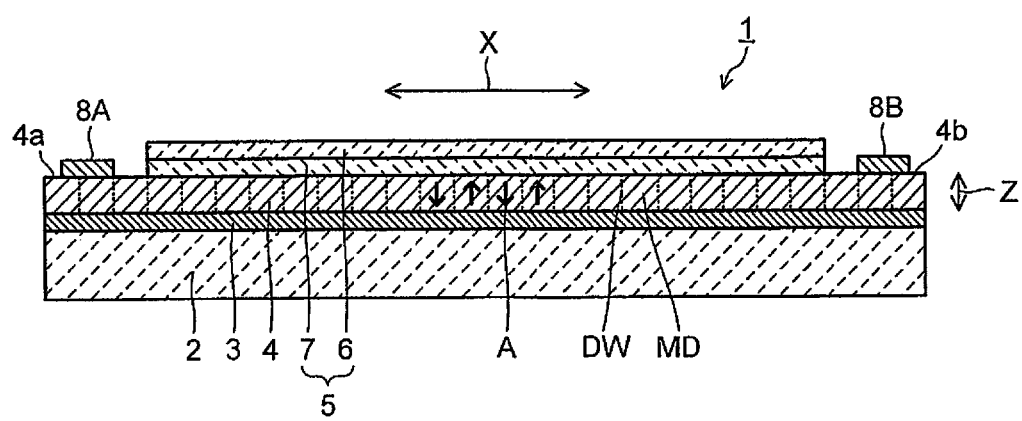
FIG. 1 is a sectional view illustrating a basic structure of a magnetic storage device of a first embodiment.

FIG. 1 is a view illustrating the structure of a magnetic storage device 1 of a first embodiment. FIG. 1 illustrates the basic structure of the magnetic storage device 1 of the first embodiment (and a later-described magnetic storage device 11 of a second embodiment). The magnetic storage device 1 of the embodiment includes a base 2 which functions as a support, an underlayer 3 disposed on the base 2 as required, a magnetic storage layer 4 as a first magnetic part disposed on the underlayer 3 and extending in a first direction, a layered part 5 stacked on the magnetic storage layer 4 in a second direction intersecting with the first direction, a first electrode 8A electrically connected with a first end portion 4a of the magnetic storage layer 4 in terms of the first direction, and a second electrode 8B electrically connected with a second end portion 4b of the magnetic storage layer 4 in terms of the first direction. The layered part 5 has a first layer 6 and a second layer 7 which is disposed between the first layer 6 and the magnetic storage layer 4. The electrodes 8A, 8B only need to be electrically connected with the first end portion 4a and the second end portion 4b of the magnetic storage layer 4 and do not necessarily have to be disposed on the magnetic storage layer 4.

The magnetic storage layer 4 extends in the first direction (X direction in FIG. 1), and has a plurality of magnetic domains MD each magnetized in, for example, a perpendicular direction (Z direction in the drawing) to the first direction (X direction). In FIG. 1, the arrows A indicate the magnetization directions of the magnetic domains MD. The plurality of magnetic domains MD are arranged side by side along the first direction X. Between adjacent ones of the magnetic domains MD, there is a domain wall DW. In the domain wall DW, the magnetization direction continuously changes from/to the magnetization directions of the two adjacent magnetic domains MD, enabling to write magnetization corresponding to storage information to each of the magnetic domains MD. The domain walls DW formed in the magnetic storage layer 4 which is a magnetic nanowire are shifted by a shift current passed to the magnetic storage layer 4 from the pair of electrodes 8A, 8B. The magnetic storage layer 4 functions as a recording layer of a domain wall displacement type (domain wall displacement layer).

The following is how magnetic information is recorded to each of the magnetic domains MD of the magnetic storage layer 4. First, magnetic information is written to one of the magnetic domains MD (cells), the shift current is passed to the magnetic storage layer 4 to shift the domain walls DW, and magnetic information is written to the next magnetic domain MD (cell). Through the repetition of the shifting of the domain walls DW and the write of the magnetic information, the necessary magnetic information is written to the magnetic storage layer 4. The magnetic information is recorded as the magnetization direction A of the magnetic domain MD. The reproduction of magnetic information stored in each of the magnetic domains MD is performed in the same manner, with the shift current being passed to the magnetic storage layer 4 in the opposite direction. Magnetic information written to one of the magnetic domains MD (cells) is read, the shift current is passed to the magnetic storage layer 4 to shift the domain walls DW, and magnetic information of the next magnetic domain MD (cell) is read. Through the repetition of the shifting of the domain walls DW and the read of the magnetic information, the magnetic information recorded in the magnetic storage layer 4 is reproduced. That is, the magnetic storage device 1 is a shift register memory where the write and the read of magnetic information are performed by the shifting of the domain walls DW of the magnetic storage layer 4. The write and the read of the magnetic information are executed by a recording/reproducing element or by a recording element and a reproducing element, which are not illustrated, and a magnetic tunnel junction (TMJ) element is used, for instance.

The magnetic storage layer 4 is preferably formed of a material having high uniaxial magnetic anisotropy in order to easily cause the magnetization in the perpendicular direction Z and improve magnetic anisotropy. Examples of such a magnetic material include a layered film and an alloy of at least one first element (transition metal element) such as iron (Fe), cobalt (Co), nickel (Ni), manganese (Mn), and chromium (Cr) and at least one second element (noble metal element) such as platinum (Pt), palladium (Pd), iridium (Ir), ruthenium (Ru), and rhodium (Rh), an amorphous alloy of the first element (transition metal element) and a third element (semimetal element) such as boron (B), silicon (Si), germanium (Ge), and antimony (Sb), and an amorphous alloy of the first element and a fourth element (rare-earth element) such as gadolinium (Gd), terbium (Tb), dysprosium (Dy), holmium (Ho), and erbium (Er). A nonmagnetic element such as gold (Au), silver (Ag), copper (Cu), aluminum (Al), magnesium (Mg), bismuth (Bi), tantalum (Ta), and carbon (C) may be added to the aforesaid magnetic material to adjust various physical properties such as magnetic properties, crystallinity, mechanical properties, and chemical properties.

The layered part 5 has the first layer 6 and the second layer 7 which is disposed between the first layer 6 and the magnetic storage layer 4. The second layer 7 is a metal oxide layer 7 functioning as a perpendicular magnetization inducing layer which induces perpendicular magnetization in the magnetic storage layer 4. Examples of a metal oxide functioning as the perpendicular magnetization inducing layer include magnesium oxide (MgO and the like) and a magnesium-aluminum composite oxide ($Mg_xAl_yO_z$). The magnesium-aluminum composite oxide is a composite oxide represented by spinet ($MgAl_2O_4$). The composite oxide is not limited to a composite whose composition has a 1:1 ratio of magnesium oxide (MgO) and aluminum oxide ($Al_2O_3$). The ratio of MgO and $Al_2O_3$ may be any, and the composite oxide may have a composition represented by, for example, $Mg_xAl_{2-x}O_{4-y}$.

The first layer 6 in the layered part 5 functions as a protection layer 6 which enhances process resistance, oxidation resistance, and so on of the metal oxide layer 7 and the magnetic storage layer 4. The protection layer 6 includes at least one selected from the group consisting of a metal nitride and a metal carbide as will be described in detail later. Providing such a protection layer 6 on the metal oxide layer 7 makes it possible not only to increase the process resistance, the oxidation resistance, and so on of the metal oxide layer 7 and the magnetic storage layer 4 but also to improve the magnetic property, for example, magnetic anisotropy represented by perpendicular magnetic anisotropy energy (Keff), of the magnetic storage layer 4 as will be described later. This enables an improvement in read accuracy of magnetic information recorded in the magnetic storage layer 4 of the magnetic storage device 1, and the stabilization of the magnetic information.

The base 2 functions as a support of the aforesaid layers 3, 4, 6, 7 and its material is, but not limited to, for example, aluminum oxide. The base 2 is not limited to a substrate that is entirely formed of the aluminum oxide, and may be, for example, one in which an aluminum oxide layer is formed on a surface of an aluminum substrate. The composing material of the base 2 is appropriately selected according to the composing material of the magnetic storage layer 4, and so on. The underlayer 3 is provided to prevent the magnetic property of the magnetic storage layer 4 from being deteriorated by thermal history, processes, and so on. Examples of the underlayer 3 include a metal film including at least one metal such as tantalum (Ta), tungsten (W), palladium (Pd), hafnium (Hf), aluminum (Al), copper (Cu), titanium (Ti), and molybdenum (Mo) (an element metal film, an alloy film, and a layered film of the above metals), a compound film including an oxide, a nitride, or the like of the aforesaid metals, and a layered film of these films.

In a magnetic storage device having a magnetic storage layer, a metal layer of tantalum (Ta) or the like has been used typically as a cap layer functioning as a protection layer of the magnetic storage layer. However, in the case where the metal oxide layer 7 including the metal oxide such as magnesium oxide and spinel is used as the perpendicular magnetization inducing layer, if the cap layer is the metal layer of Ta or the like, part of oxygen bonded with the metal (for example, Mg) in the metal oxide layer 7 (for example, an MgO layer) bonds with Ta in the cap layer due to heat treatment and a working process following the formation of the protection layer, and the MgO layer is separated into MgO and Mg, which may worsen the crystallinity of MgO. As a result, the perpendicular magnetic anisotropy of the magnetic storage layer 4 which is the domain wall displacement layer may deteriorate, leading to the deterioration in the magnetic property.

In consideration of the above, the magnetic storage device 1 of the embodiment employs the protection layer 6 including at least one selected from the group consisting of the metal nitride and the metal carbide. Examples of the metal nitride forming the protection layer 6 include tantalum nitride (TaN and the like), niobium nitride (NbN and the like), tungsten nitride ($W_2N$ and the like), molybdenum nitride ($Mo_2N$ and the like), chromium nitride (CrN and the like), aluminum nitride (AlN and the like), titanium nitride (TiN and the like), zirconium nitride (ZrN and the like), hafnium nitride (HfN and the like), boron nitride (BN and the like), and magnesium nitride ($Mg_3N_2$). Examples of the metal carbide forming the protection layer 6 include tantalum carbide (TaC and the like), tungsten carbide (WC and the like), molybdenum carbide ($Mo_2C$ and the like), chromium carbide ($Cr_2C_3$ and the like), aluminum carbide ($Al_4C_3$ and the like), titanium carbide (TiC and the like), zirconium carbide (ZrC and the like), hafnium carbide (MC and the like), boron carbide ($B_4C$ and the like), silicon carbide (SiC and the like), and magnesium carbide ($Mg_3C_2$).

Figure 2:
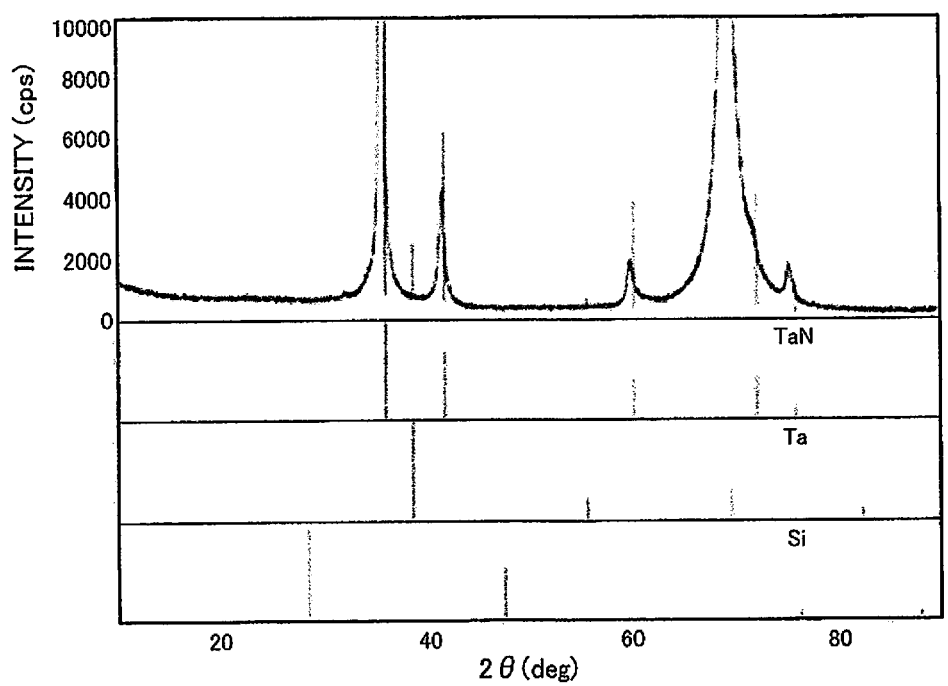
FIG. 2 is a chart illustrating an X-ray diffraction result of a TaN film.

A difference between the protection layer 6 including the metal nitride and/or the metal carbide of the embodiment and the aforesaid protection layer formed of the metal film of tantalum (Ta) or the like will be described in detail. First, in order to confirm the composition of a TaN film which is one example of the composing material of the protection layer 6 in the embodiment, an about 100 nm TaN film was fabricated on thermally oxidized silicon by reactive sputtering in a mixed gas of Ar and nitrogen, using a DC magnetron sputtering method. The examination of a composition ratio (N/Ta) of Ta and N by ICP emission spectrometry showed that the composition was slightly N-rich, with the N/Ta ratio being about 1.5 or less. FIG. 2 illustrates an X-ray diffraction result of the TaN film. In the X-ray diffraction result in FIG. 2, almost all the confirmed peaks were TaN peaks though they were slightly shifted, and no diffraction peak of the Ta metal was confirmed. From this, it is thought that the TaN film as the protection layer 6 is a nitride film with only a small amount of the Ta metal.

Figure 3:
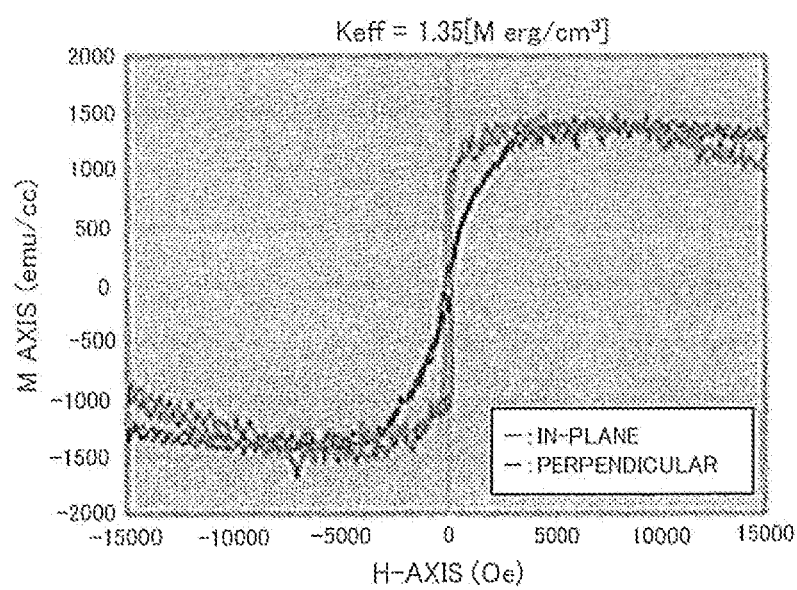
FIG. 3 is a chart illustrating magnetization curves and Keff of a sample according to an example.
Figure 4:
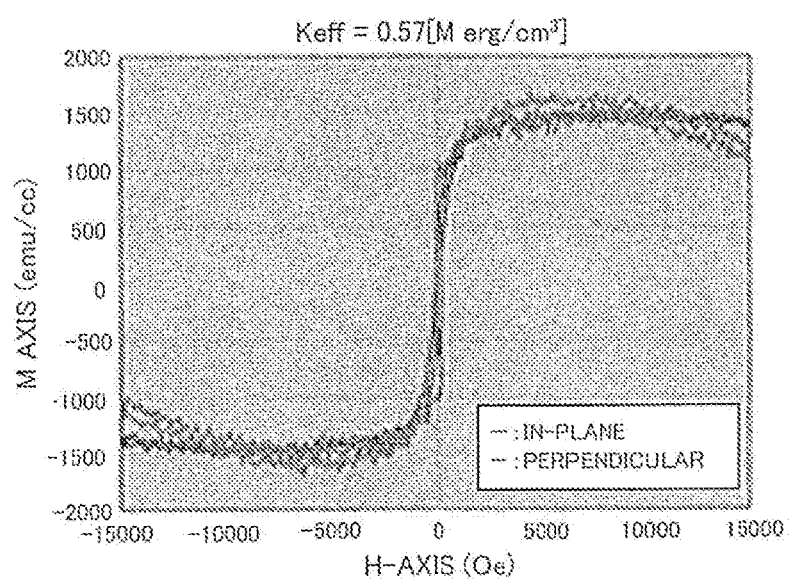
FIG. 4 is a chart illustrating magnetization curves and Keff of a sample according to a comparative example.

Then, the layers 3, 4, 7, 6 of the magnetic part illustrated in FIG. 1 were formed as solid films (without patterns) on a sapphire substrate by a DC magnetron sputtering method, and the perpendicular magnetic anisotropy energy (Keff) of the resultant having undergone heat treatment was calculated from magnetization curves (an in-plane direction and a direction perpendicular to the film plane) measured with a vibrating sample magnetometer (VSM). As a film structure of the magnetic part of an example, the following films were sequentially formed on the sapphire substrate ($Al_2O_3$): a Ta film with a 1 nm film thickness as the underlayer 3, a $Co_{40}Fe_{40}B_{20}$ film with a 1.2 nm film thickness as the magnetic storage layer 4, an MgO film with an about 2 nm film thickness as the metal oxide layer 7, and a TaN film with an about 1 nm film thickness as the protection layer 6, whereby a sample was fabricated. Further, as a comparative example, a sample was fabricated in which a Ta film with a 1 nm film thickness was formed as the protection layer instead of the TaN film, using tantalum (Ta) as a forming material of the protection layer. The heat treatment was performed under the condition of 250° C.×1 hour in the absence of a magnetic field. FIG. 3 illustrates the magnetization curves of the sample (layered film) of the example and its Keff. FIG. 4 illustrates the magnetization curves of the sample (layered film) of the comparative example and its Keff. Keff of the layered film of the example is 1.4 Merg/cm$^3$ as illustrated in FIG. 3, while Keff of the layered film of the comparative example has a small value of 0.6 Merg/cm$^3$ as illustrated in FIG. 4, which shows that the use of the material of the protection layer of the embodiment contributes to a reduction in Keff deterioration of the perpendicular magnetization film.

A possible reason for the aforesaid difference in Keff is as follows. In the case where the Ta film is formed as the protection layer 6 on the metal oxide layer (MgO film) 7 which is the perpendicular magnetization inducing layer, after the protection layer 6 is formed, oxygen in the atmosphere and tantalum bond with each other at a stage when it is exposed to the atmosphere, resulting in a state of "$TaO_x$+Ta+adsorbed oxygen". When this is heat-treated, unoxidized Ta bonds with part of oxygen of MgO, and as a result, the crystallinity of MgO may deteriorate. On the other hand, the TaN film which is the protection layer 6 described in the example is in a state of "$TaO_x$+TaN+adsorbed oxygen" at a stage when it is exposed to the atmosphere, and the adsorbed oxygen and $TaO_x$ bond with each other prior to the heat treatment, and as a result, the crystallinity of the MgO film may hardly deteriorate. This may be a reason for the difference in Keff.

From a viewpoint of free energy of formation of the nitrides and the oxides of the elements, the free energy of formation of MgO is "−136 kcal/mol", while, in the protection layer 6, the free energy of formation of $Ta_2O_3$ is "−457 kcal/mol" and the free energy of formation of TaN is "−54 kcal/mol". Therefore, the use of TaN whose free energy of formation has a smaller absolute value than that of MgO makes it possible to reduce an amount of the unoxidized Ta in the protection layer 6, and as a result, an amount of oxygen necessary for the unoxidized Ta to be $Ta_2O_3$ reduces, leading to a relative reduction in an amount of oxygen deficiency of MgO.

The aforesaid condition regarding the composing material of the protection layer 6 is not limited to the relation between the free energy of formation of MgO and the free energy of formation of TaN. Specifically, if the absolute value of the free energy of formation of the metal nitride forming the protection layer 6 is relatively smaller than the absolute value of the free energy of formation of the metal oxide forming the metal oxide layer 7, it is possible to prevent the metal oxide forming the metal oxide layer 7 from being deprived of oxygen. Such an effect is obtained not only in the case of the metal nitride. In a case where the protection layer 6 is formed of a metal carbide, if an absolute value of the free energy of formation of the metal carbide is relatively smaller than the absolute value of the free energy of formation of the metal oxide forming the metal oxide layer 7, it is possible to obtain the same effect.

Table 1 shows the free energies of formation of oxides, nitrides, and carbides of various metal elements. As is apparent from Table 1, the free energies of formation of the metal nitrides and the metal carbides have mostly smaller absolute values than the absolute values of the free energies of formation of the metal oxides. By forming the protection layer 6 using a metal nitride or a metal carbide, out of these, whose free energy of formation has a smaller absolute value than the absolute value of the free energy of formation of the metal oxide forming the metal oxide layer 7, it is possible to reduce an amount of the oxygen deficiency of the metal oxide layer 7 to reduce the deterioration in Keff. From the free energies of formation of the oxides, the nitrides, and the carbides of the various metal elements in Table 1, it is seen that the aforesaid specific examples of the metal nitride and the metal carbide as the composing material of the protection layer 6 are effective.

TABLE 1

| Compound | Free energy of formation [kcal/mol] |
| --- | --- |
| $Mo_2C$ | −2 |
| WC | −9 |
| $W_2N$ | −11 |
| $Mo_2N$ | −12 |
| SiC | −12 |
| $B_4C$ | −13 |
| $Mg_3C_2$ | −18 |
| CrN | −24 |
| HfN | −29 |
| HfC | −38 |
| $Al_4C_3$ | −38 |
| TaC | −38 |
| TiC | −43 |
| ZrC | −43 |
| $Cr_2C_3$ | −44 |
| NbN | −51 |
| TaN | −54 |
| BN | −56 |
| AlN | −56 |
| TiN | −74 |

TABLE 1-continued

| Compound | Free energy of formation [kcal/mol] |
|---|---|
| ZnO | −76 |
| ZrN | −87 |
| $Mg_3N_2$ | −96 |
| TiO | −117 |
| $MoO_2$ | −118 |
| $CrO_3$ | −121 |
| $WO_2$ | −125 |
| MgO | −136 |
| $MoO_3$ | −162 |
| $WO_3$ | −182 |
| $SiO_2$ | −197 |
| $TiO_2$ | −212 |
| $ZrO_2$ | −248 |
| $Cr_2O_3$ | −253 |
| HfO | −253 |
| $MgAl_2O_4$ | −260 |
| $B_2O_3$ | −286 |
| $Ti_2O_3$ | −344 |
| $Al_2O_3$ | −378 |
| $Ta_2O_3$ | −457 |

Figure 5:
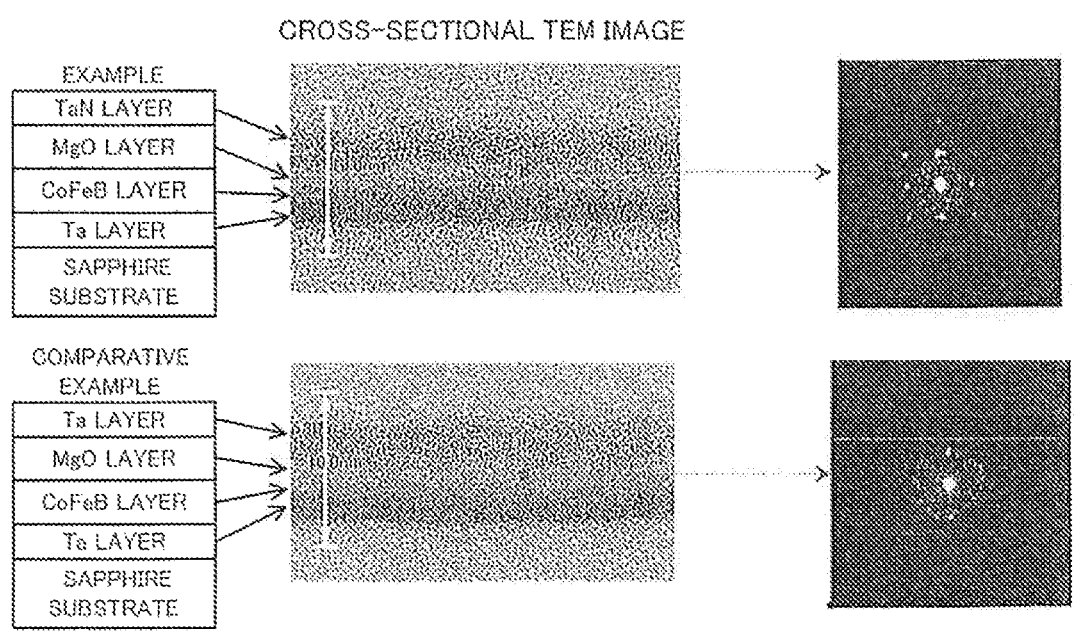
FIG. 5 is a chart illustrating sectional TEM images and nano-beam electron diffraction images of the samples according to the example and the comparative example.

Next, in order to verify the aforesaid difference in Keff, cross-sectional TEM images and nano-beam electron diffraction images of the films of the example and the comparative example were observed. FIG. 5 illustrate the results. First, from the cross-sectional TEM images of the MgO films which are the perpendicular magnetization inducing layers (the white portions near the center), it is seen that, in the sample using the protection layer of the example, a lattice image of MgO is observed, but in the cross-sectional TEM image of the comparative example, a lattice of MgO is unclear. Further, from the nano-beam electron diffraction images of these portions, it is seen that, in the example, diffraction spots indicating that the lattice of the MgO film is aligned in the film sectional direction are clear, while, in the comparative example, such a diffraction spot is unclear. From this, it is thought that the crystallinity of the MgO film which is the perpendicular magnetization inducing layer suffered less deterioration in crystallinity and consequently, Keff less deteriorated because the TaN film was used as the protection layer. This applies not only to the case where the TaN film is used as the protection layer 6, but also applies to the case where a metal nitride or a metal carbide satisfying the aforesaid condition is used. Note that the protection layer 6 including the metal nitride and/or the metal carbide may include a metal oxide or an element metal after the heat treatment as previously described.

Second Embodiment

Figure 6:
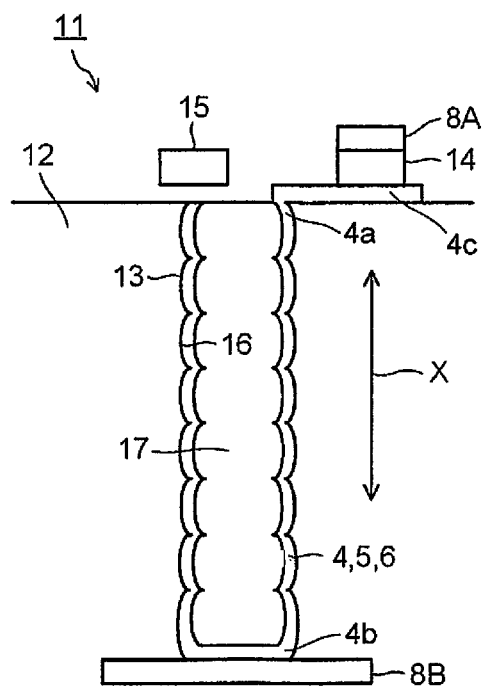
FIG. 6 is a sectional view illustrating a magnetic storage device of a second embodiment.

FIG. 6 is a view illustrating the structure of the magnetic storage device 11 of the second embodiment. In the magnetic storage device 11 illustrated in FIG. 6, the X direction in FIG. 6 is the extension direction (first direction) of the magnetic storage layer 4. The magnetic storage device 11 of the second embodiment has an aluminum oxide layer 12 formed on a substrate (not illustrated). In the aluminum oxide layer 12, a memory hole 13 is formed. The memory hole 13 is formed by an anodic oxidation method or the like after a starting point of an aluminum layer is formed by nanoimprint or the like at a place which is to be the starting point. In such a memory hole 13, the first magnetic part 4 and the layered part 5 are formed. The structures of the first magnetic part 4 and the layered part 5 are the same as those of the first embodiment, the underlayer 3 is formed as required, and the specific structures of these layers 3, 4, 5 are the same as those of the first embodiment. The first magnetic part 4 has a cylindrical shape, and the layered part 5 surrounds the outer periphery of the first magnetic part 4. Further, in the memory hole 13, a nonmagnetic insulator part 17 such as silicon oxide ($SiO_x$) or the like extends in the first direction X and having a columnar shape, and the cylindrical first magnetic part 4 surrounds the periphery of the nonmagnetic insulator part 17.

Figure 7:
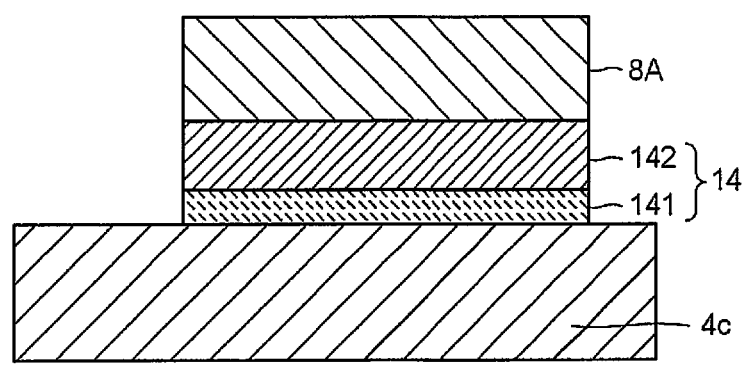
FIG. 7 is an enlarged sectional view of part of the magnetic storage device of the second embodiment.

A second magnetic part 4c is connected with the upper end portion 4a, of the first magnetic part 4, protruding from the memory hole 13, and a magnetic reproducing element 14 such as an MTJ element is provided on the second magnetic part 4c. The magnetic reproducing element 14 may have a recording function. As illustrated in FIG. 7, the MTJ element as the magnetic reproducing element 14 or the like includes the second magnetic part 4c, a third magnetic part 142 disposed to face at least part of the second magnetic part 4c, and a nonmagnetic part 141 disposed between the at least part of the second magnetic part 4c and the third magnetic part 142. The first electrode 8A is disposed on the third magnetic part 142 and is electrically connected with the first end portion 4a of the first magnetic part 4 through the third magnetic part 142, the nonmagnetic part 141, and the second magnetic part 4c. The lower end portion 4b of the first magnetic part 4 disposed in the memory hole 13 is electrically connected with the electrode 8B. In FIG. 6, 15 represents a field wire, which extends in a direction intersecting with the X direction. A current passed to the field wire 15 generates a current magnetic field, and by this current magnetic field, magnetic information is written to the magnetic storage layer 4.

An inner wall of the memory hole 13 has dented surfaces 16 which are cyclically provided. Forming the magnetic storage layer 4 as the first magnetic part on such dented surfaces 16 in a curved shape facilitates forming the magnetic domains of the magnetic storage layer 4 and facilitates regulating shift positions of the domain walls each present between the adjacent magnetic domains. That is, the magnetic storage layer 4 alternately include portions whose sections intersecting with the first direction have a long outer periphery and portions whose sections intersecting with the first direction have a short outer periphery. At the time of the shift of the domain walls in the magnetic storage layer 4, since energy necessary for the domain walls to cross over boundaries between the dented surfaces 16 is easily set, the size of each magnetic domain is easily set to a predetermined range, and it is possible to enhance the stability of the magnetic domain, and further, the shift range of the domain wall is easily set. Because of these, it is possible to enhance recording/reproducing properties and so on of the magnetic storage device 11. In the example described here, the dented surfaces 16 cyclically formed on the inner wall of the memory hole 13 are in the curved shape, but instead of the dented surfaces 16 in the curved shape, linearly dented surfaces having triangular sections or the like, curved protruding portions, linearly protruding portions, a combination of dented portions and protruding portions, or the like may be employed.

EXAMPLES

Example 1, Comparative Example 1

A magnetic storage element including a magnetic nanowire (magnetic part) having a 2 μm width and an about 1000 μm length and electrodes formed on both ends of the magnetic nanowire was fabricated. The film structure of the magnetic nanowire was as follows. On a sapphire substrate ($Al_2O_3$), a Ta film with a 1 nm film thickness was formed as the underlayer 3, a $Co_{40}Fe_{40}B_{20}$ film with a 1.2 nm film thickness was formed as the magnetic storage layer 4 thereon, an MgO film with an about 2 nm film thickness was formed as the metal oxide layer 7 thereon, and a TaN film with an about 1 nm film thickness was further formed as the protection layer 6 thereon. After the film formation, the element was heat-treated under the condition of 250° C.×1 hour in the absence of a magnetic field. A magnetic field was applied to one end surface of such an element in a direction perpendicular to the film plane by an electromagnet to record information. Next, the magnetically recorded information was shifted under a varied current density, a shift state of the magnetic information was confirmed with a Kerr effect observation device, and a critical current density (Jc [$\mu A/cm^2$]) when the magnetic information was shifted at this time was examined. Further, regarding an element (comparative example 1) where a Ta film with an about 1 nm film thickness was formed instead of the TaN film, a critical current density (Jc) was similarly examined. As a result, Jc of the element of the example 1 was about 104 $\mu A/cm^2$, while Jc of the element of the comparative example 1 was about 140 $\mu A/cm^2$ Jc and thus a current density larger by about 35% was required. This shows that the use of the protection layer (TaN film) of the example 1 enables a great reduction in Jc, and has led to the confirmation of the validity of its effect.

Examples 2 to 4, Comparative Example 2

Magnetic storage elements each including a magnetic nanowire (magnetic part) and electrodes formed on both ends of the magnetic nanowire were fabricated as in the example 1. The film structure of the magnetic nanowire was as follows. On a sapphire substrate ($Al_2O_3$), a W film with a 1 nm film thickness was formed as the underlayer 3, a $Co_{40}Fe_{40}B_{20}$ film with a 1.2 nm film thickness was formed as the magnetic storage layer 4 thereon, an $MgAl_2O_4$ film with an about 2 nm film thickness was formed as the metal oxide layer 7 thereon, and the protection layer 6 with an about 1 nm film thickness was further formed thereon. A composing material of the protection layer 6 was TaN in an example 2, WN in an example 3, and HfN in an example 4. After the film formation, the elements were heat-treated under the condition of 300° C.×1 hour in the absence of a magnetic field. A critical current density (Jc) of each of such elements was examined as in the example 1. Further, regarding an element (comparative example 2) whose protection layer was a Ta film with an about 1 nm film thickness, a critical current density (Jc) was similarly examined. As a result, Jc of the element of the example 2 was about 37 $\mu A/cm^2$, Jc of the element of the example 3 was about 50 $\mu A/cm^2$, Jc of the element of the example 4 was about 45 $\mu A/cm^2$, and Jc of the element of the comparative example 2 was about 150 $\mu A/cm^2$ Jc. This shows that the use of the film structure of the examples 2 to 4 (the underlayer was changed to W from Ta used in the example 1) enables a great reduction in Jc, and has led to the confirmation of the validity of its effect.

Example 5

An element having the same film structure as any of those of the examples 1 to 4 is applicable to a magnetic storage element whose element structure is illustrated in FIG. 6, and the same effect as those of the examples 1 to 4 can be obtained.

While certain embodiment s have been described, these embodiments have been presented by way of example only, and are not intended to limit the scope of the inventions. Indeed, the novel embodiments described herein may be embodied in a variety of other forms: furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic storage device comprising:
   a first magnetic part including a first portion and a second portion and extending in a first direction from the first portion and the second portion;
   a layered part stacked on the first magnetic part in a second direction intersecting with the first direction;
   a first electrode electrically connected with the first portion; and
   a second electrode electrically connected with the second portion, wherein the layered part includes a first layer and a second layer which is disposed between the first layer and the first magnetic part, the second layer includes a metal oxide, and the first layer includes at least one selected from a group consisting of a metal nitride and a metal carbide.

2. The device according to claim 1, wherein an absolute value of free energy of formation of the at least one selected from the group is smaller than an absolute value of free energy of formation of the metal oxide.

3. The device according to claim 1,
   wherein the second layer includes at least one selected from the group consisting of a magnesium oxide and a magnesium-aluminum composite oxide, and
   wherein the first layer includes at least one selected from the group consisting of tantalum nitride, niobium nitride, tungsten nitride, molybdenum nitride, chromium nitride, aluminum nitride, titanium nitride, zirconium nitride, hafnium nitride, boron nitride, magnesium nitride, tantalum carbide, tungsten carbide, molybdenum carbide, chromium carbide, aluminum carbide, titanium carbide, zirconium carbide, hafnium carbide, boron carbide, silicon carbide, and magnesium carbide.

4. The device according to claim 1, further comprising a second magnetic part extending in a third direction intersecting with the first direction and connected with the first portion of the first magnetic part,
   wherein the first electrode is electrically connected with the first portion through the second magnetic part.

5. The device according to claim 4, further comprising:
   a third magnetic part disposed to face at least part of the second magnetic part; and
   a nonmagnetic layer disposed between the at least part of the second magnetic part and the third magnetic part.

6. The device according to claim 5, wherein the first electrode is electrically connected with the first portion through the third magnetic part, the nonmagnetic layer, and the second magnetic part.

7. The device according to claim 4, further comprising:
   a field wire which extends in a fourth direction intersecting with the first direction and which writes information to the second magnetic part.

8. The device according to claim 1, wherein the first magnetic part has a cylindrical shape, and the layered part surrounds a periphery of the first magnetic part.

9. The device according to claim 1, further comprising a nonmagnetic insulator part extending in the first direction,
wherein the first magnetic part surrounds a periphery of the nonmagnetic insulator part, and the layered part surrounds a periphery of the first magnetic part.

10. The device according to claim 1, wherein the first magnetic part alternately includes a portion whose section intersecting with the first direction has a first outer periphery and a portion whose section intersecting with the first direction has a second outer periphery, and a length of the first outer periphery is longer than a length of the second outer periphery.

11. A magnetic storage device comprising:
a nonmagnetic insulator part extending in a first direction;
a first magnetic part including a first portion and a second portion and extending in the first direction from the first portion to the second portion, the first magnetic part surrounding the nonmagnetic insulator part in a second direction intersecting with the first direction;
a layered part surrounding the first magnetic part in the second direction;
a first electrode electrically connected with the first portion; and
a second electrode electrically connected with the second portion, wherein the layered part includes a first layer and a second layer which is disposed between the first layer and the first magnetic part, the second layer includes a metal oxide, and the first layer includes at least one selected from a group consisting of a metal nitride and a metal carbide.

12. The device according to claim 11, wherein an absolute value of free energy of formation of the at least one selected from the group is smaller than an absolute value of free energy of formation of the metal oxide.

13. The device according to claim 11,
wherein the second layer includes at least one selected from the group consisting of a magnesium oxide and a magnesium-aluminum composite oxide, and
wherein the first layer includes at least one selected from the group consisting of tantalum nitride, niobium nitride, tungsten nitride, molybdenum nitride, chromium nitride, aluminum nitride, titanium nitride, zirconium nitride, hafnium nitride, boron nitride, magnesium nitride, tantalum carbide, tungsten carbide, molybdenum carbide, chromium carbide, aluminum carbide, titanium carbide, zirconium carbide, hafnium carbide, boron carbide, silicon carbide, and magnesium carbide.

14. The device according to claim 11, further comprising a second magnetic part extending in a third direction intersecting with the first direction and connected with the first portion of the first magnetic part,
wherein the first electrode is electrically connected with the first portion through the second magnetic part.

15. The device according to claim 14, further comprising:
a third magnetic part disposed to face at least part of the second magnetic part; and
a nonmagnetic layer disposed between the at least part of the second magnetic part and the third magnetic part.

16. The device according to claim 15, wherein the first electrode is electrically connected with the first portion through the third magnetic part, the nonmagnetic layer, and the second magnetic part.

17. The device according to claim 14, further comprising:
a field wire which extends in a fourth direction intersecting with the first direction and which writes information to the second magnetic part.

18. The device according to claim 11, wherein the first magnetic part has a cylindrical shape.

19. The device according to claim 11, wherein the nonmagnetic insulator part has a columnar shape,
wherein the first magnetic part surrounds a periphery of the nonmagnetic insulator part, and the layered part surrounds a periphery of the first magnetic part.

20. The device according to claim 11, wherein the first magnetic part alternately includes a portion whose section intersecting with the first direction has a first outer periphery and a portion whose section intersecting with the first direction has a second outer periphery, and a length of the first outer periphery is longer than a length of the second outer periphery.

* * * * *